United States Patent [19]

Okamoto

[11] Patent Number: 5,508,647
[45] Date of Patent: Apr. 16, 1996

[54] NOISE SHAPER FOR PREVENTING NOISE IN LOW FREQUENCY BAND

[75] Inventor: Toshiyuki Okamoto, Tokyo, Japan

[73] Assignee: NEC Corporation, Tokyo, Japan

[21] Appl. No.: 508,762

[22] Filed: Jul. 31, 1995

Related U.S. Application Data

[63] Continuation of Ser. No. 79,523, Jun. 21, 1993, abandoned.

[30] Foreign Application Priority Data

Jun. 19, 1992 [JP] Japan ............................... 4-161481
Jun. 22, 1992 [JP] Japan ............................... 4-162350

[51] Int. Cl.⁶ .......................... H03B 1/00; H03K 17/16
[52] U.S. Cl. ..................... 327/167; 327/312; 327/552; 326/31
[58] Field of Search ........................ 328/127, 167, 328/162, 165; 307/520, 542; 327/552, 312; 326/31; 341/155

[56] References Cited

U.S. PATENT DOCUMENTS

| 3,201,705 | 8/1965 | Hanulec ............................. 328/127 |
| 4,772,871 | 9/1988 | Suzuki ............................... 341/155 |
| 5,191,331 | 3/1993 | Karema .............................. 341/131 |

FOREIGN PATENT DOCUMENTS 100236  8/1979  Japan ............................... 328/127

OTHER PUBLICATIONS

IEEE Transactions on Circuit Theory, vol. CT-15 No. 4 Dec. 1968.

Peter J. A. Naus et al., "A CMOS Stereo 16-bit D/A Converter for Digital Audio", *IEEE Journal of Solid-State Circuits,* vol. SC-22, No. 3, Jun. 1987, pp. 390–394.

*Primary Examiner*—Anita Pellman Gross
*Assistant Examiner*—Tiep H. Nguyen
*Attorney, Agent, or Firm*—Young & Thompson

[57] ABSTRACT

A noise shaper includes an incomplete integrator which conducts an addition of a present data and a last sampled data stored and a positive coefficient smaller than 1, a complete integrator which conducts an addition of a storage data before one sample delay and a present data, a three-value quantizing circuit which outputs 0, +1 or -1 signal as an output signal, and a feedback circuit which feeds-back the output signal from the three-value quantizing circuit to the incomplete integrator and the complete integrator. The noise shaper may further include a delay-data supply selection circuit which supplies the last sampled data stored and the positive coefficient to the incomplete integrator only when the output signal supplied from the three-value quantizing circuit through the feed-back circuit is zero. The output signal from the noise shaper can be made zero without deteriorating signal to noise (S/N) ratio when no input signal is inputted to the noise shaper.

4 Claims, 5 Drawing Sheets

NOISE SHAPER FOR PREVENTING NOISE IN LOW FREQUENCY BAND

This application is a continuation of application Ser. No. 08/079,523, filed Jun. 21, 1993, now abandoned.

BACKGROUND OF THE INVENTION

(1) Field of the Invention

The present invention relates to a noise shaper, and more particularly to a noise shaper which prevents the occurrence of noise in a low frequency band.

(2) Description of the Related Art

Figure 1:
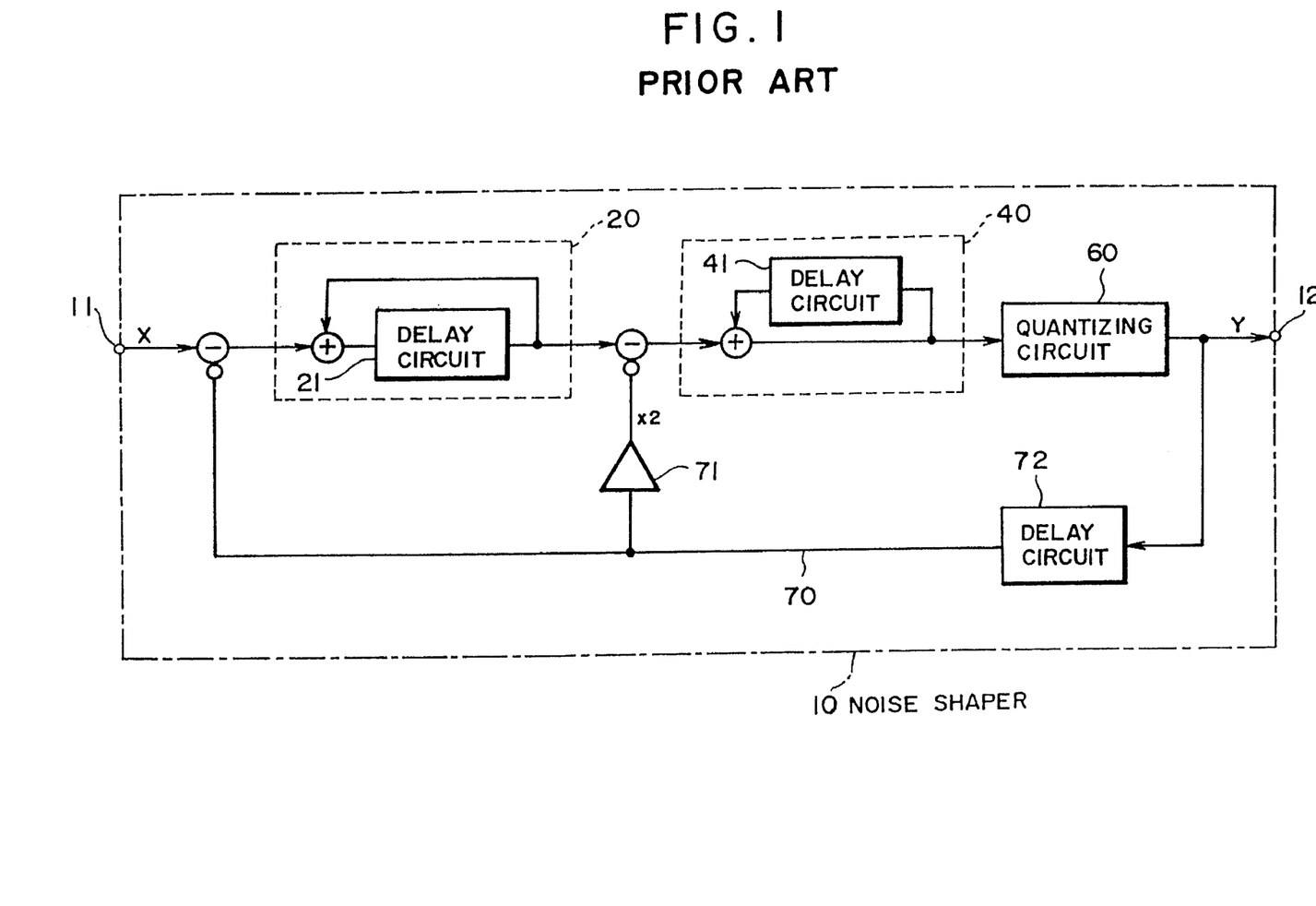
FIG. 1 is a block diagram showing a prior art noise shaper.

FIG. 1 shows a conventional noise shaper of a three-value output type of the kind to which the present invention relates. The noise shaper 10 shown includes a first integrator 20 formed by a delay circuit 21, a second integrator 40 formed by a delay circuit 41, a quantizing circuit 60 which receives an output of the second integrator 40 and outputs a three-value signal (i.e., 0, +1, or −1), and a feedback circuit 70 for feeding back an output of the quantizing circuit 60 to the first and second integrators 20 and 40. The feedback circuit 70 includes a delay circuit 72 and an amplifier 71.

The operation of the above conventional noise shaper is explained with reference to FIG. 1. The first integrator 20 receives and integrates a difference between an output signal Y of the quantizing circuit 60 and an input signal X supplied to an input terminal 11 of the noise shaper 10. The second integrator 40 receives and integrates a difference between an output signal of the first integrator 20 and a signal resulting from the output signal of the quantizing circuit 60 being amplified by 2 by the amplifier 71. The output signal of the second integrator 40 is forwarded to the quantizing circuit 60. Here, the quantizing circuit 60 outputs a signal of "+1" when the input signal applied thereto is larger than +½, a signal of "0" when the input signal is between −½ and +½, and a signal of "1" when the input signal is lower than −½.

In the above operations, the relationship between the input signal X and the output signal Y of the noise shaper 10, when the quantizing noise produced in the quantizing circuit 60 is Q, may be expressed by the following equation (1).

$$Y(z)=X(z)+(1-Z^{-1})^2 \cdot Q(z) \tag{1}$$

Thus, the output spectrum developed at the output terminal 12 of the noise shaper 10 shown in FIG. 1 is a spectrum in which a signal produced by the second-order differentiation of a quantizing noise of the noise shaper is superimposed to the input signal. Since the quantizing noise is shaped and superimposed in a high frequency band, the sum of noise components within a signal in-band is substantially reduced.

However, in the conventional noise shaper described above, there is a problem in that, when no signal is inputted to the noise shaper, the spectrum contained in the output signal allows a low frequency component to appear more as the initial value of the first integrator 20 becomes smaller.

More specifically, in the above conventional noise shaper, when no signal is inputted thereto, if the initial data at the delay circuits 21 and 41 in the first and second integrators 20 and 40 is zero, it can be appreciated that the output signal will be zero. On the other hand, if the data at the delay circuits 21, 41 in the integrators 20, 40 at the initial state is not zero but the initial value of the first integrator 20 is, for example, 0.5, then the output Y of the noise shaper 10 repeats +1 and −1 and never becomes zero. If the initial value of the first integrator 20 is smaller than 0.5 and is, for example, 0.1, then the output Y repeats +1, −1, eight times continuously of 0, +1, −1 and eight times continuously of 0 , . . . It can be appreciated from the above that, where the initial value at the first integrator 20 is not zero, the output Y of the noise shaper 10 never becomes zero, and the smaller the initial value at the first integrator 20, the more frequent is the appearance of zero to follow +1 and −1. The problem resulting therefrom is that low frequency components contained in the spectrum of the output is allowed to be increased.

SUMMARY OF THE INVENTION

It is, therefore, an object of the present invention to overcome the problem existing in the conventional noise shaper and to provide an improved noise shaper which, when there is no input signal, enables to raise a noise frequency in the output signal and, when the initial value of the integrator is small and there is no input signal, enables to make the output signal zero.

According to one aspect of the invention, there is provided a noise shaper comprising:

an incomplete integrator which receives an input signal supplied to an input terminal, and which conducts an addition of a present data and a signal of product of a storage data before one sample delay and a coefficient value of a positive value smaller than 1 set by a coefficient setter;

a complete integrator which receives an output signal from the incomplete integrator, and which conducts an addition of a storage data before one sample delay and a present data;

a three-value quantizing circuit which receives an output signal from the complete integrator, and which outputs to an output terminal 0, +1 or −1 signal as an output signal; and a feedback circuit which feeds-back the output signal from the three-value quantizing circuit to the incomplete integrator and the complete integrator.

According to the invention, the noise shaper has a integration circuit of one or more stages and at least one integration circuit is not a complete integrator realized by adding to the present or current data an accumulated data before one sample delay but is an incomplete integrator realized by adding to the present data a product of an accumulated data before one sample delay and a positive coefficient smaller than 1. The output of the integration circuit is inputted to the quantizing circuit, is converted to three-values, namely, 0, +1 and −1, based on predetermined threshold values, and becomes an output of the noise shaper. This output of the noise shaper is fed-back by a feedback circuit and is outputted to the integration circuit together with an input to the noise shaper. Due to this arrangement, the noise shaper according to the invention operates in such a way that, when there is no input signal, the noise frequency contained in the output signal can be raised without the deterioration of S/N ratio and that, when the initial value of the integrator is small, the output signal can be zero.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanying drawings.

Figure 2:
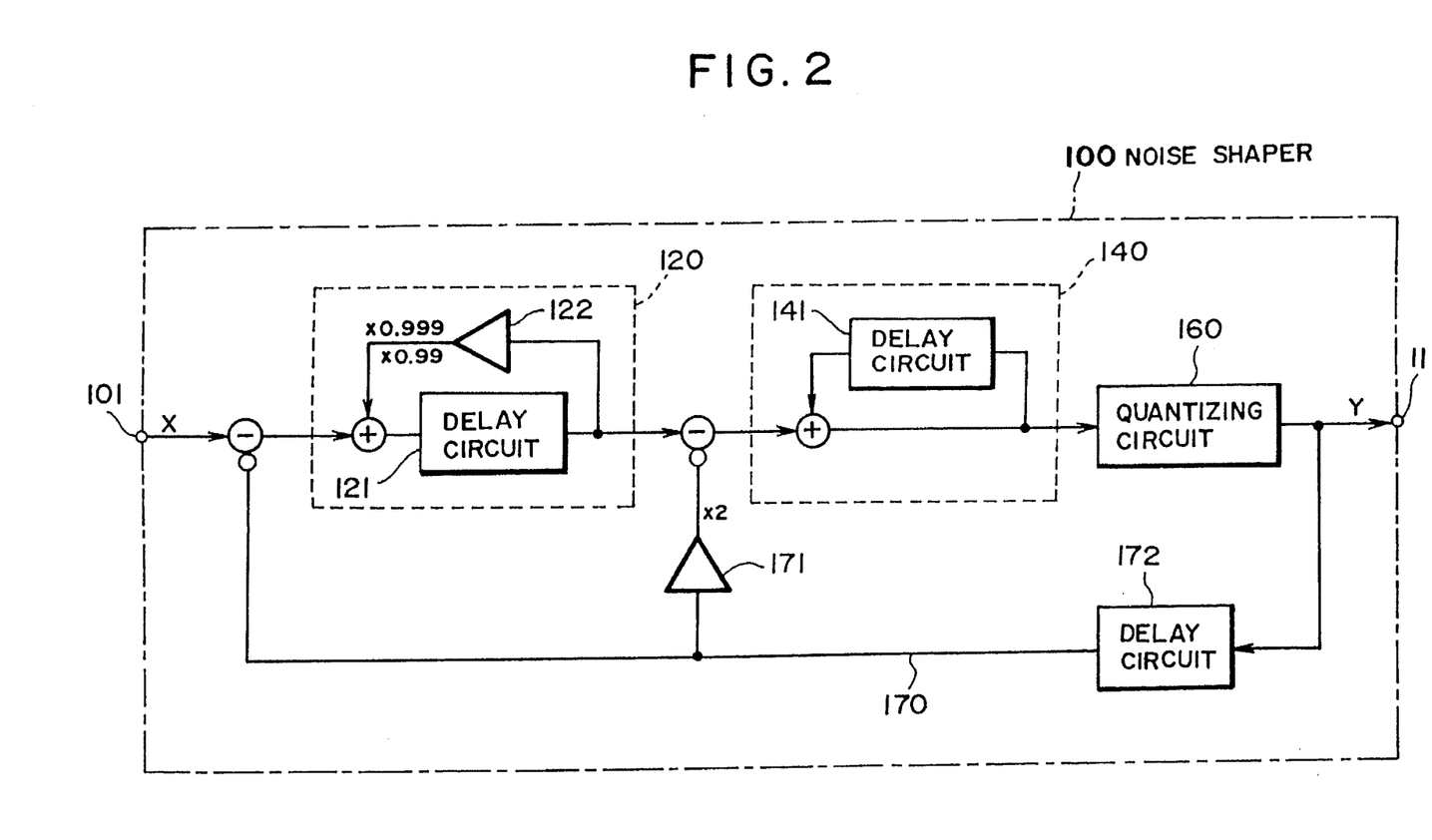
FIG. 2 is a block diagram showing a noise shaper of a first and a second embodiment according to the invention.

FIG. 2 is a block diagram showing a noise shaper 100 of a first embodiment according to the invention. The noise shaper 100 of this embodiment shown in FIG. 2 and that of the prior art shown in FIG. 1 are alike in the general arrangements, but the configuration of the first integrator 120 is not the same as that of the first integrator 20 in the prior art noise shaper 10. Specifically, the first integrator 120 is, unlike in the prior art noise shaper 10, an incomplete integrator which is formed by a delay circuit 121 and a coefficient setter 122 having a positive coefficient smaller than 1, for example, 0.999, and which conducts an addition of 0.999 times a storage data before one sample delay last sampled data stored and the present data. The second integrator 140 is a complete integrator which is formed by a delay circuit 141 and which conducts an addition of the storage data before one sample delay and the present data. The feedback circuit 170 includes an amplifier 171 and a delay circuit 172.

Now, the operation of the above noise shaper 100 of the first embodiment is explained. The first integrator 120 receives and integrates a difference between the output signal of the quantizing circuit 160 and the input signal X supplied to this noise shaper 100. The second integrator 140 receives and integrates a difference between an output signal from the first integrator 120 and a signal resulting from the output signal from the quantlzlng circuit 160 being amplified by 2 by the amplifier 171. The output signal of the second integrator 140 is inputted to the quantlzlng circuit 160. Here, the quantizing circuit 160 outputs a +1 signal if the input signal is higher than +½, a zero signal if the input signal is between −½ and +½, and a −1 signal if the input signal is lower than −½.

In the above operations, the relationship between the input signal X and the output signal Y of the noise shaper 100, when the quantlzlng noise produced in the quantizing circuit 160 is Q, may be expressed by the following equation (2).

$$Y(z)=Z^{-1}\cdot X(z)/P(z)+(1-Z^{-1})(1-0.999Z^{-1})\cdot Q(z)/P(z) \quad (2)$$

wherein $P(z) =0.001Z^{-2} +0.001Z^{-1} +1$. In the above equation (2), P(z) substantially equals 1 regardless of frequencies. Thus, the output spectrum developed at the output terminal 111 of the noise shaper 100 shown in FIG. 2 is a spectrum in which a signal produced by the second-order differentiation of a quantizing noise of the noise shaper is superimposed to the input signal. Since the quantizing noise is shaped and superimposed in a high frequency band, the sum of noise components within a signal in-band is substantially reduced.

With regard to the above operations, the operation which takes place when there is no input signal to the noise shaper 100 is discussed. Firstly, when the initial values of the first and second integrators 120 and 140 are zero, it can be appreciated that the output code will be zero. When the initial value of the first integrator 120 is, for example, 0.005, the integral output of the second integrator 140 will be 0.005, 0.000995, 0.00148505 and so on and will infinitely approach 0.5 . So, the output of the quantizing circuit 160 is always zero. On the other hand, if the initial value of the first integrator 120 is 0.001, the integral output of the second integrator 140 will be larger than 0.5 after 693 samplings and the output of the quantizing circuit 160 will be +1, −1. Thereafter, the quantizing circuit 160 outputs +1, −1 about every 700 samplings. Thus, in the noise shaper 100 of this embodiment, if the sampling frequency is fs, there appears noise in the output which has a spectrum on the order of fs/700. This noise never appears in the in-band region if the over-sampling ratio of the noise shaper is set to greater than 1000.

Next, the second embodiment according to the invention is explained with reference also to FIG. 2. The noise shaper of this embodiment and the noise shaper 100 of the first embodiment shown in FIG. 2 are alike in the general arrangements, but the configurations of the first integrators 120 are not the same. Specifically, the first integrator 120 of this embodiment is an incomplete integrator which is formed by the delay circuit 121 and the coefficient setter 122 having a coefficient of 0.99 and which conducts an addition of a 0.99 times a last-sampled data stored and the present data. The second integrator 140 is a complete integrator realized by the addition of the storage data before one sample delay and the present data.

In the above operations concerning the second embodiment, the relationship between the input signal X and the output signal Y of the noise shaper, when the quantizing noise produced in the quantizing circuit 160 is Q, may be expressed by the following equation (3).

$$Y(z)=Z^{-1}\cdot X(z)/P(z)+(1-Z^{-1}) (1- 0.999Z^{-1})\cdot Q(z)/P(z) \quad (3)$$

wherein $P(z)=0.01Z^{-2}+0.01Z^{-1}+1$. In the above equation (3), P(z) substantially equals 1 regardless of frequencies. Thus, the output spectrum developed at the output terminal 111 of the noise shaper of this embodiment is a spectrum in which a signal produced by the second-order differentiation of a quantizing noise of the noise shaper is superimposed to the input signal. Since the quantizing noise is shaped and superimposed in a high frequency band, the sum of noise components within a signal in-band is substantially reduced.

With regard to the above operations, the operation which takes place when there is no input signal to the noise shaper is discussed. Firstly, when the initial values of the first and second integrators 120 and 140 are zero, it can be appreciated that the output code will be zero. Secondly, when the initial value of the first integrator 120 is, for example, 0.005, the integral output of the second integrator 140 will be 0.005, 0.00995, 0.0148505 and so on and will infinitely approach 0.5 . So, the output of the quantizing circuit 160 is always zero. On the other hand, if the initial value of the first integrator 120 is 0.01, the integral output of the second integrator 140 will be larger than 0.5 after 69 samplings and the output of the quantizing circuit 160 will be +1, −1. Thereafter, the quantizing circuit 160 outputs +1, −1 every about 70 samplings. Thus, in the present noise shaper, if the sampling frequency is fs, there appears in the output a noise which has a spectrum the order of fs/70. This noise never appears in the signal-in region if the over-sampling ratio of the noise shaper is set to more than 100.

In the noise shaper of the second embodiment as explained above, the larger the integral leakage of the first integrator 120, the higher the noise frequency can be when there is no input signal. However, due to this, the degree in which the quantizing noise within the signal in-band is shaped is reduced resulting in the deterioration of signal-to-noise (S/N) ratio.

Figure 3:
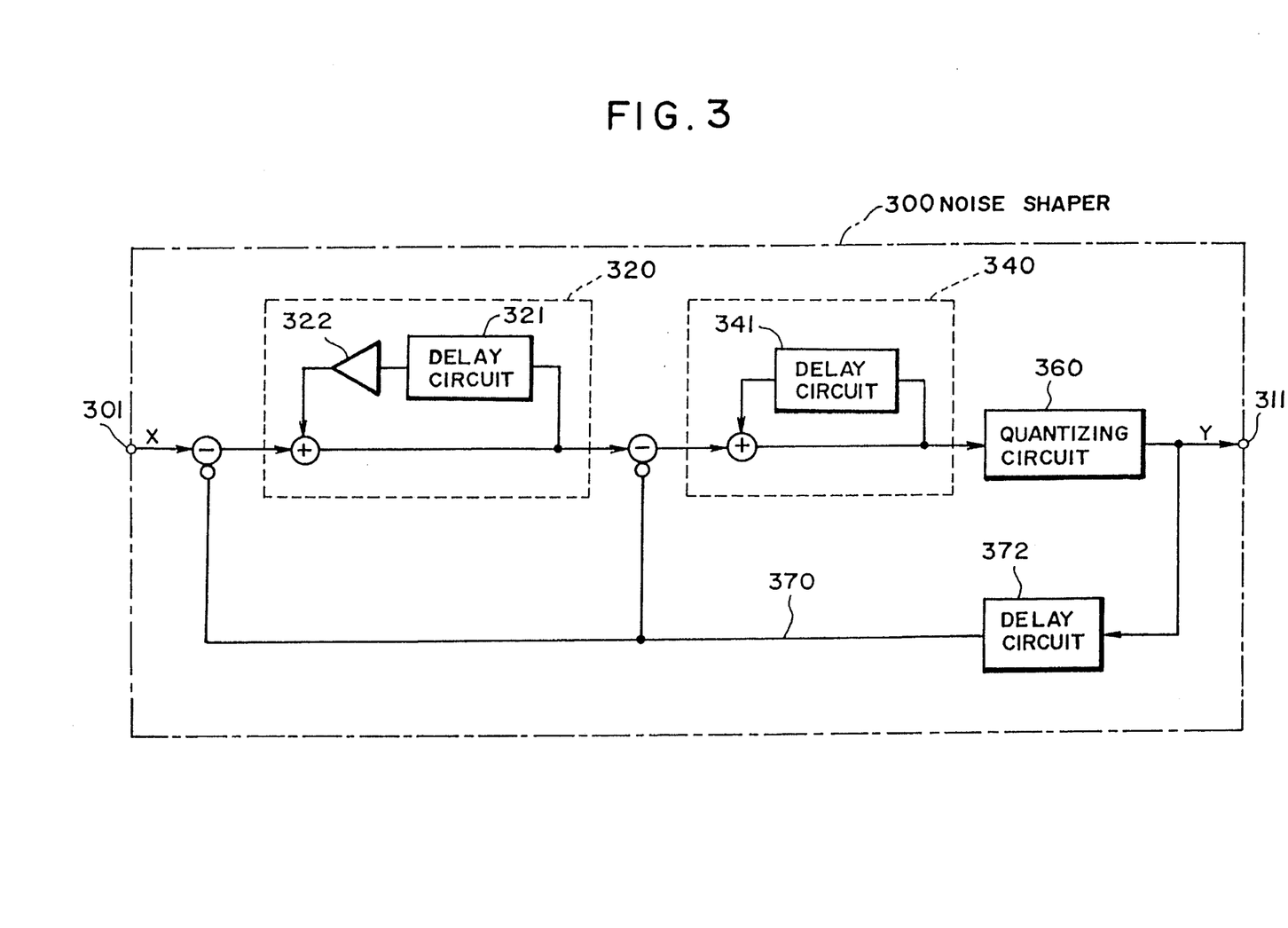
FIG. 3 is a block diagram showing a noise shaper of a third embodiment according to the invention.

Next, the third embodiment according to the invention is explained with reference to FIG. 3. The noise shaper 300 of this embodiment includes a first integrator 320, a second integrator 340, a quantlzlng circuit 360 which receives an output of the second integrator 340 and outputs a three-value level signal based on ±0.5 as being the threshold values, and a feedback circuit 370 which feeds back the output of the quantizing circuit 360 to the first and second integrators 320 and 340. The feedback circuit 370 includes a delay circuit 372. In the feedback circuit, the amplification factor in which the output of the quantizing circuit 360 is fedback to the second integrator 340 is "1" unlike that in the first embodiment shown in FIG. 2 of the invention.

The first integrator 320 of this embodiment is an incomplete integrator which is formed by a delay circuit 321 and a coefficient setter 322 and which conducts an addition of 0.999 times a last-sample data stored and the present data. The second integrator 340 is a complete integrator realized by the addition of the storage data before one sample delay and the present data.

Now, the operation of the above noise shaper 300 of this third embodiment is explained. The first integrator 320 receives and integrates a difference between the output signal of the quantizing circuit 360 and the input signal X supplied to the input terminal 301 of the noise shaper 300. The second integrator 340 receives and integrates a difference between an output signal from the first integrator 320 and the output signal of the quantlzlng circuit 360. The output signal of the second integrator 340 is inputted to the quantizing circuit 360. Here, the quantizing circuit 360 outputs a +1 signal if the input signal is higher than +½, a zero signal if the input signal is between −½ and +½, and a −1 signal if the input signal is lower than −½.

In the above operations, the relationship between the input signal X and the output signal Y of the noise shaper 300, when the quantizing noise produced in the quantizing circuit 360 is Q, may be expressed by the following equation (4).

$$Y(z)=X(z)/P(z)+(1-Z^{-1})(1-0.999Z^{-1})\cdot Q(z)/P(z) \quad (4)$$

wherein $P(z) = 0.01Z^{-2} + 0.01Z^{-1} + 1$. In the above equation (4), P(z) substantially equals 1 regardless of frequencies. Thus, the output spectrum developed at the output terminal 311 of the noise shaper 300 shown in FIG. 3 is a spectrum in which a signal produced by the second-order differentiation of a quantlzlng noise is superimposed to the input signal. Since the quantizing noise is shaped and superimposed in a high frequency band, the sum of noise components within a signal in-band is substantially reduced.

With regard to the above operations, the operation which takes place where there is no input signal to the noise shaper 300 is discussed. Firstly, when the initial values of the first and second integrators 320 and 340 are zero, it can be appreciated that the output code will be zero. Secondly, when the initial value of the first integrator 320 is, for example, 0.0005, the integral output of the second integrator 340 will be 0, 0.0004995, 0.0004995 and so on and will infinitely approach 0.5 . So, the output of the quantizing circuit 360 will always be zero. On the other hand, if the initial value of the first integrator 320 is 0.001, the integral output of the second integrator 340 will be larger than 0.5 after 624 samplings and the output of the quantizing circuit 360 will be +1, −1. Thereafter, the quantlzlng circuit 360 outputs +1, −1 every about 700 samplings. Thus, in the present noise shaper, if the sampling frequency is fs, there appears in the output the noise which has a spectrum on the order of fs/700 . This noise never appears in the signal-in region if the over-sampling ratio of the noise shaper is set to more than 100. In this case, it is also possible to calculate the output of the quantizing circuit 360 similarly as above by changing the initial value of the first integrator 320.

Next, the fourth embodiment of the invention is explained with reference to FIG. 4.

Figure 4:
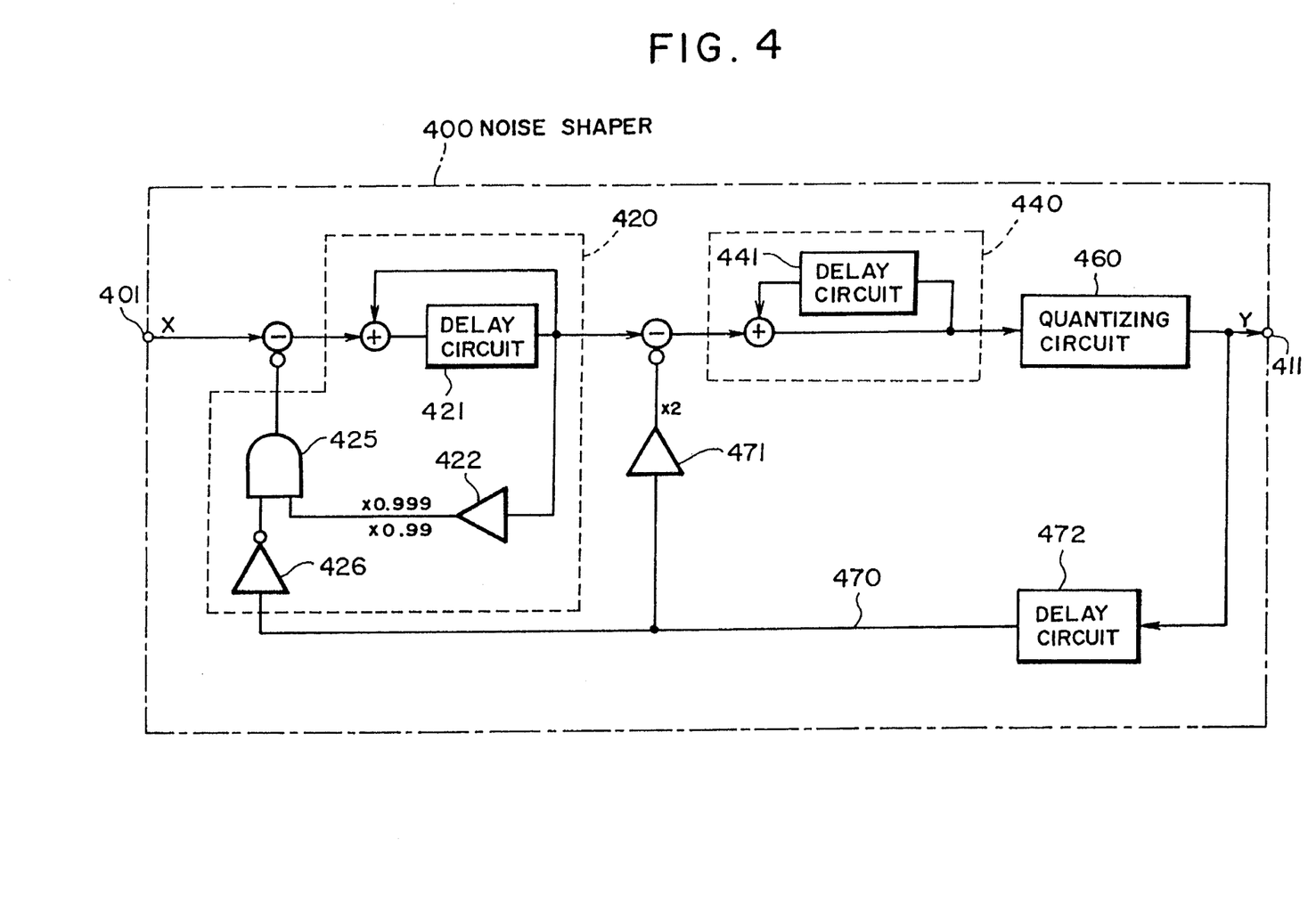
FIG. 4 is a block diagram showing a noise shaper of a fourth and a fifth embodiment according to the invention.

In FIG. 4, the noise shaper 400 of the fourth embodiment according to the invention includes a first integrator 420, a second integrator 440, a quantizing circuit 460 which outputs a three-value level based on ±0.5 as being the threshold values, and a feedback circuit 470. The feedback circuit 470 includes an amplifier 471 and a delay circuit 472. The first integrator 420 receives and integrates difference between the output signal of the quantizing circuit 460 and the input signal X supplied to the input terminal 401. Also, the second integrator 440 receives and integrates a of difference between an output signal of the first integrator 420 and a signal resulting from the output of the quantizing circuit 460 being amplified by 2 by the amplifier 471. The output of the second integrator 440 is inputted to the quantizing circuit 460. The quantizing circuit 460 outputs a +1 signal if the input is higher than +½, a zero signal if the input is between −½ and +½, and a −1 signal if the input is lower than −½. Furthermore, the first integrator 420 is an incomplete integrator realized by the addition of 0.999 times a last-sampled data stored and the present data with such subtraction being made only when the one sample delay data of the quantizing circuit 460 is zero, and the second integrator 440 is a complete integrator realized by the addition of the a last-sampled data stored and the present data. When the one sample delay data from the quantlzlng circuit 460 is zero, an AND gate 425 is opened by an inverter 426. The AND gate 425, and the inverter 426 constitute a delay-data supply selection circuit.

Where the arrangements are made as above, the relationship between the input signal X and the output signal Y of the noise shaper 400, where the quantizing noise produced in the quantizing circuit 460 is Q, may be expressed by the following equation (5).

$$Y(z)=Z^{-1}\cdot X(z)/P(z)+(1-Z^{-1})(1-0.999Z^{-1})\cdot Q(z)/P(z) \quad (5)$$

wherein $P(z) = 0.001Z^{-2} + 0.001Z^{-1} + 1$. In the above equation (5), P(z) substantially equals 1 regardless of frequencies. Thus, the output spectrum developed at the output terminal 411 of the noise shaper 400 shown in FIG. 4 is a spectrum in which a signal produced by the second-order differentiation of a quantizing noise of the noise shaper is superimposed to the input signal. Since the quantizing noise is shaped and superimposed in a high frequency band, the sum of noise components within a signal-in band is substantially reduced.

With regard to the above operations, the operation which takes place where there is no input signal to the noise shaper is discussed. When the initial values of first and second integrators 420 and 440 are zero, it can be appreciated that the output code will be zero. When the initial value of the first integrator 420 is, for example, 0.0005, the output of the second integrator 440 will be 0.0005, 0.000995, 0.00148505 and so on and will infinitely approach 0.5. That is, the output of the quantizing circuit 460 will always be zero. On the other hand, if the initial value of the first integrator 420 is 0.001, the output of the second integrator 440 will be larger than 0.5 after 693 samplings and the output of the quantizing circuit 460 will be +1, −1. At this time, there will be an storage data of about 0.0005 in the first integrator 420 and the output of the quantizing circuit 460 will always be zero in the same way as in the operations already discussed above. Also, it can be appreciated that, even where the initial value of the first integrator 420 is large, the output will always end up in zero with the cycle of outputting +1, −1 becoming gradually longer.

Now, the noise shaper of the fifth embodiment according to the invention is explained with reference also to FIG. 4. The first integrator 420 is an incomplete integrator which includes a delay circuit 421 and a coefficient setter 422 having a coefficient value of 0.99, and which conducts an addition of a 0.99 time a last-sampled data storage and the present data. Such addition in the first integrator 420 is made only when the one sample delay data of the quantizing circuit 460 is zero. The second integrator 440 is a complete integrator realized by the addition of the storage data before one sample delay and the present data.

Where the arrangements are made as above, the relationship between the input signal X and the output signal Y of the noise shaper 400, where the quantizing noise produced in the quantizing circuit 470 is Q, may be expressed by the following equation (6).

$$Y(z)=Z^{-1} \cdot X(z)/P(z)+(1-Z^{-1})(1-0.999Z^{-1}) \cdot Q(z)/P(z) \quad (6)$$

wherein $P(z) = 0.01Z^{-2} + 0.01Z^{-1} + 1$. In the above equation (6), P(z) substantially equals 1 regardless of frequencies. Thus, the output spectrum developed at the output terminal 411 of the noise shaper 400 shown in FIG. 4 is a spectrum in which a signal produced by the second-order differentiation of a quantizing noise of the noise shaper is superimposed to the input signal. Since the quantizing noise is shaped and superimposed in a high frequency band, the sum of noise components within a signal in-band is substantially reduced.

With regard to the above operations, the operation which takes place when there is no input signal to the noise shaper 400 is discussed. When the initial values of first and second integrators 420 and 440 are zero, it can be appreciated that the output code will be zero. When the initial value of the first integrator 420 is 0.005, the output of the second integrator 440 will be 0.005, 0.00995, 0.0148505 and so on and will infinitely approach 0.5. Accordingly, the output of the quantizing circuit 460 will always be zero. On the other hand, if the initial value of the first integrator 420 is 0.01, the output of the second integrator 440 will be larger than 0.5 after 69 samplings and the output of the quantlzlng circuit 460 will be +1,−1. At this time, there will be the storage data of about 0.005 in the first integrator 420 and the output of the quantizing circuit 460 will always be zero in the same way as in the operations already discussed above. Also, it can be appreciated that, even when the initial value of the first integrator 420 is large, the output will always end up in zero with the cycle of outputting +1,−1 becoming gradually longer.

Figure 5:
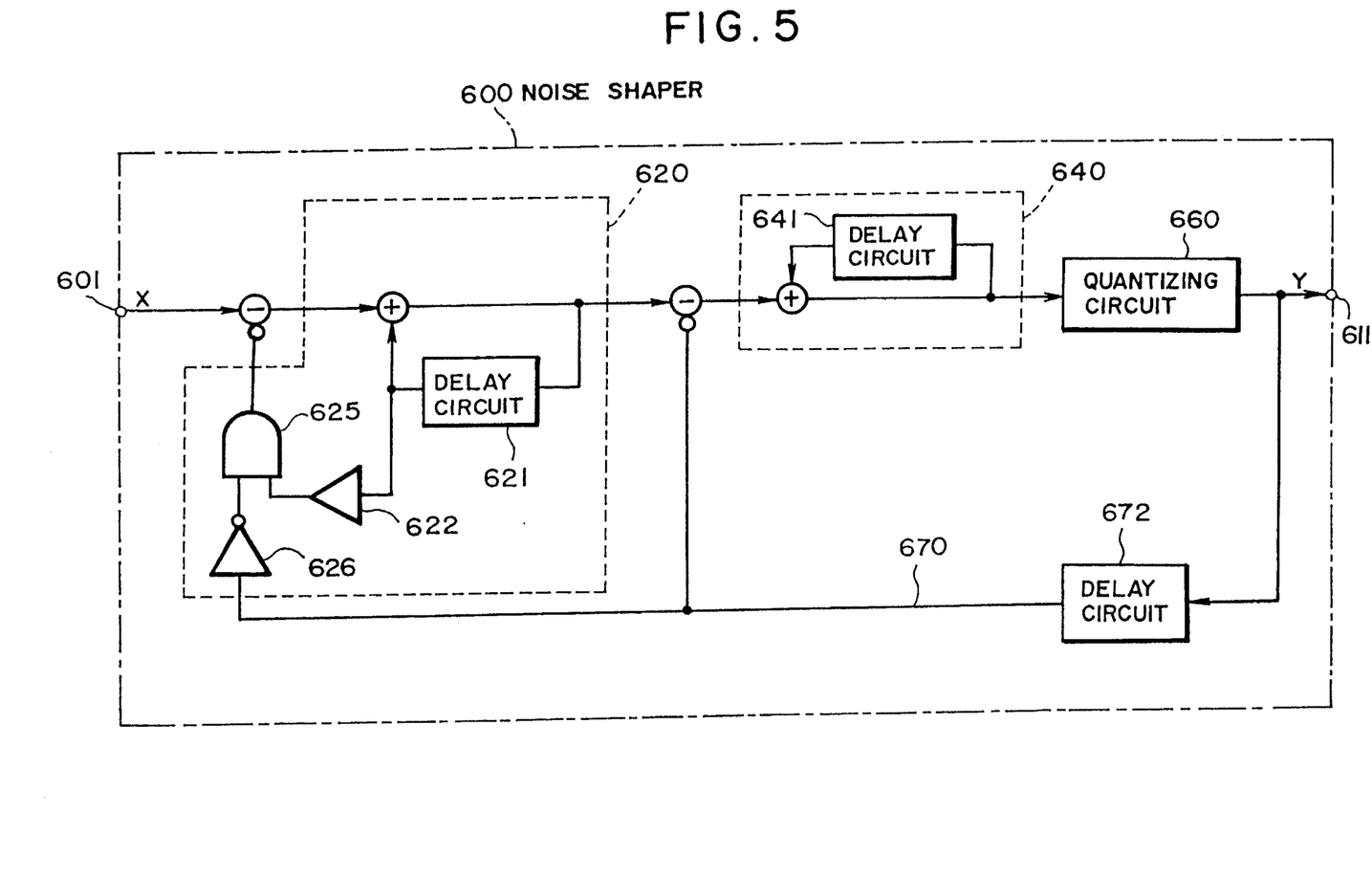
FIG. 5 is a block diagram showing a noise shaper of a sixth embodiment according to the invention.

Lastly, the noise shaper of the sixth embodiment is explained with reference to FIG. 5. As seen in FIG. 5, the noise shaper 600 of this embodiment includes a first integrator 620, a second integrator 640, a quantizing circuit 660 which outputs a three-value level based on ±+0.5 as being the threshold values, and a feedback circuit 670 formed by a delay circuit 672. The first integrator 620 receives and integrates a signal of difference between the output signal of the quantizing circuit 660 and the input signal X supplied to the input terminal 611 of the noise shaper 600. Also, a difference signal between an output signal of the first integrator 620 and an output signal of the quantizing circuit 660 is inputted to and differentiated at the second integrator 640. Here, a +1 signal is outputted if the input is higher than +½, a zero signal is outputted if the input is between −½ and +½, and a −1 signal is outputted if the input is lower than −½. Furthermore, the first integrator 620 is an incomplete integrator which includes a delay circuit 621 and a coefficient setter 622 having a positive coefficient of 0.999, addition of 999 times a last-sampled data stored and the present data. Such addition at the first integrator 620 is made only when the one sample delay data from the quantizing circuit 660 is zero. The second integrator 440 is a complete integrator realized by the addition of the a last-sample, data stored and the present data. When the one sample delay data from the quantizing circuit 660 is zero, an AND gate 625 is opened by an inverter 626. The AND gate 625 and the inverter 626 constitute a delay-data supply selection circuit.

Where the arrangements are made as above, the relationship between the input signal X and the output signal Y of the noise shaper 600, where the quantizing noise produced in the quantizing circuit 660 is Q, may be expressed by the following equation (7).

$$Y(z)=X(z)/P(z)+(1-Z^{-1})(1-0.999Z^{-1}) \cdot Q(z)/P(z) \quad (7)$$

wherein $P(z) = 0.001Z^{-1} + 1$. In the above equation (7), P(z) substantially equals 1 regardless of frequencies. Thus, the output spectrum developed at the output terminal 611 of the noise shaper 600 shown in FIG. 5 is a spectrum in which a signal produced by the second-order differentiation of a quantizing noise of the noise shaper is superimposed to the input signal. Since the quantizing noise is shaped and superimposed in a high frequency band, the sum of noise components within a signal-in band is substantially reduced.

With regard to the above operations, the operation which takes place when there is no input signal to the noise shaper 600 is discussed. When the initial values of first and second integrators 620 and 640 are zero, it can be appreciated that the output code will be zero. When the initial value of the first integrator 620 is 0.0005, the output of the second integrator 640 will be 0, 0.0004995, 0.0004995, ... and so on and will infinitely approach 0.5. Accordingly, the output of the quantizing circuit 660 will always be zero. On the other hand, if the initial value of the first integrator 620 is 0.001, the output of the second integrator 640 will be larger than 0.5 after 624 samplings and the output of the quantizing circuit 660 will be +1, −1. At this time, there will be a storage data of about 0.0005 in the first integrator 620 and the output of the quantizing circuit 660 will always be zero in the same way as in the operations already discussed above. Also, it can be appreciated that, even when the initial value of the first integrator 620 is large, the output will always end up in zero with the cycle of outputting +1, −1 becoming gradually longer.

As explained hereinabove, according to the noise shaper of the present invention, the output signal can be made zero without deteriorating the S/N when no input signal is inputted to the noise shaper.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A noise shaper comprising:

an incomplete integrator which receives an input signal supplied to an input terminal, and which conducts an addition of a present data and a signal which is a product of a last-sampled data stored and a coefficient value of a positive value smaller than 1 set by a coefficient setter;

a complete integrator whose input terminal is coupled to an output terminal of said incomplete integrator, and which conducts an addition of a last-sampled data stored and a present data;

a three-value quantizing circuit which receives an output signal from said complete integrator, and which outputs to an output terminal 0, +1 or −1 signal as an output signal; and a feedback circuit which feeds-back the output signal from said three-value quantizing circuit to said incomplete integrator and said complete integrator, wherein said noise shaper is a sigma-delta noise shaper.

2. A noise shaper according to claim 1, wherein said coefficient setter has the coefficient value of 0.999.

3. A noise shaper according to claim 1, in which said coefficient setter has the coefficient value of 0.99.

4. A noise shaper according to claim 1, wherein said feedback circuit is formed by a delay circuit and an amplifier, the output signal from said three-value quantizing circuit being fed-back to said complete integrator after being amplified by 2 by said amplifier.

* * * * *